United States Patent [19]

van de Plassche

[11] 4,405,900

[45] Sep. 20, 1983

[54] OPERATIONAL AMPLIFIER

[75] Inventor: Rudy J. van de Plassche, Eindhoven, Netherlands

[73] Assignee: U.S. Philips Corporation, New York, N.Y.

[21] Appl. No.: 252,483

[22] Filed: Apr. 8, 1981

[30] Foreign Application Priority Data

May 9, 1980 [NL] Netherlands ................. 8002666

[51] Int. Cl.³ .................................................. H03F 3/45
[52] U.S. Cl. .................................... 330/151; 330/253; 330/255
[58] Field of Search ................. 330/126, 151, 253, 255

[56] References Cited

U.S. PATENT DOCUMENTS 3,408,586 10/1968 Ordower .................... 330/151 X

OTHER PUBLICATIONS

Hosticka et al., "MOS Sampled Data Recursive Filters Using Switched Capacitor Integrators", IEEE Journal of Solid-State Circuits, vol. SC-12, No. 6, Dec. 1977, pp. 600–608.

Primary Examiner—James B. Mullins
Attorney, Agent, or Firm—Thomas A. Briody; William J. Streeter; Edward W. Goodman

[57] ABSTRACT

An operational amplifier having a first amplifier stage and a second amplifier stage, which is driven by the first amplifier stage. According to the invention such an operational amplifier can be corrected for high frequencies in a very simple and effective manner by including a capacitance in parallel with the second amplifier stage between an output of the first stage and an output of the second stage which is comparatively high-ohmic relative to said output of the first stage. The second stage, which is bypassed by said capacitance, is then non-inverting for the part bypassed by said capacitance.

9 Claims, 12 Drawing Figures

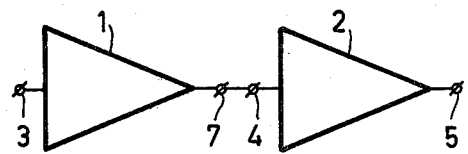
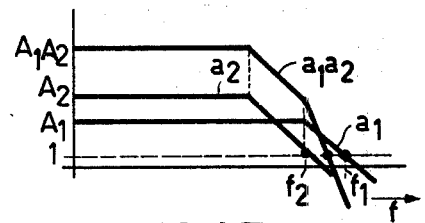
FIG.1A PRIOR ART  FIG.1B
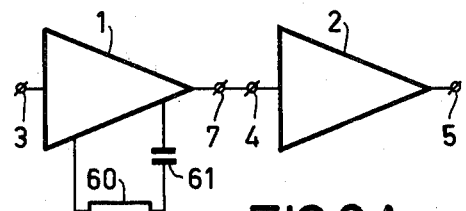
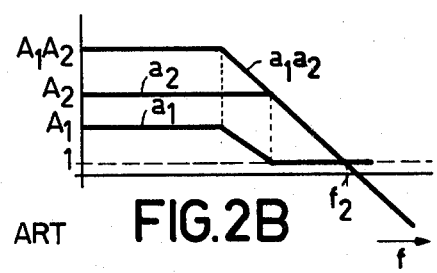
FIG.2A PRIOR ART  FIG.2B
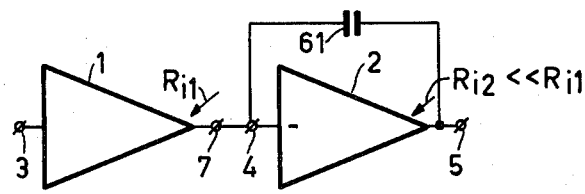
FIG.3 PRIOR ART
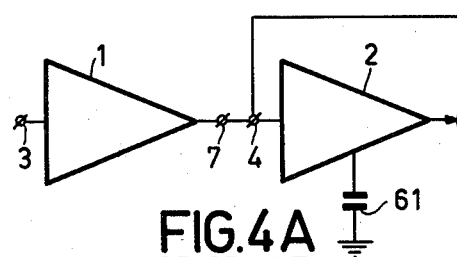
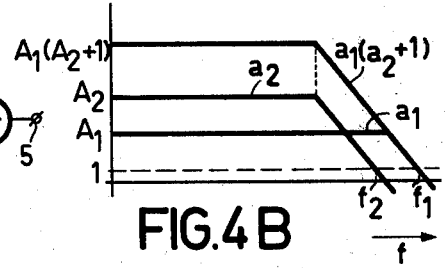
FIG.4A PRIOR ART  FIG.4B
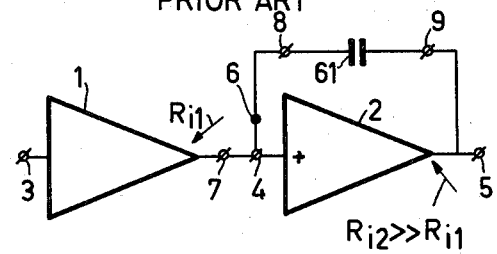
FIG.5

OPERATIONAL AMPLIFIER

BACKGROUND OF THE INVENTION

The invention relates to an operational amplifier comprising at least a first amplifier stage, a second amplifier stage, which is driven by the first amplifier stage, and a first and a second junction point between which a capacitive signal path, for improving the high-frequency properties of the operational amplifier, is included or is to be included.

When two amplifier stages are connected one after the other in an operational amplifier—the first amplifier stage generally having the larger bandwith—the problem arises that the combined gain of the two stages exhibits a roll-off of 12 dB per octave over a comparatively wide range and especially in the frequency range where the open-loop gain of the combination of the two stages decreases to unity, so that the provision of feedback across the operational amplifier may give rise to instabilities. In order to preclude this problem, high-frequency correction networks are included in operational amplifiers. This is frequently left at the discretion of the user of said operational amplifier by the provision of suitable terminals.

A first known correction method is inter alia eemployed in an integrated circuit which is commercially available under type number $\mu A$ 709 and which is described in "Philips Data Handbook-Signetics integrated circuits 1978", pages 100-106. In accordance with this method, the bandwidth of the first amplifier stage is made smaller than the bandwidth of the second stage by means of an RC-network in such a way that the gain of the first stage decreases to unity. The high-frequency roll-off is then determined by the second stage and is then substantially 6 dB per octave. In the case of a suitable choice of said RC-network, the roll-off in gain over the entire frequency range beyond the frequency at which the gain of the combination has decreased to unity is substantially equal to 6 dB per octave.

A similar effect can be obtained by another correction method, which is inter alia employed in an integrated circuit which is available under type number $\mu A$ 741 and which is described in the Handbook on page 60-65. Here use is made of the Miller effect, enabling a capacitor with a small capacitance to be used, which facilitates integration of said capacitor. The second amplifier stage is then shunted by the capacitor. Said second amplifier stage is then inverting—which is essential for the Miller effect—and the impedance of the output of the second stage, seen from said capacitor, is comparatively low relative to the impedance of the output of the first stage, again seen from the capacitor. The effect of this step may be described as a reduction of the bandwidth of the first stage, because, for high frequencies the output of said first stage is short-circuited to the comparatively low-ohmic output of the second stage via said capacitor, and the integrating effect of the second stage to which negative feedback is applied via said capacitor. The result of said step corresponds to the result of the first-mentioned step.

Drawbacks of these known and frequently employed correction methods are that the bandwidth of the combination is limited to the bandwidth of said second stage, which, when these correction methods are employed, also has the smaller bandwidth of the two amplifier stages, and that the signal-to-noise ratio of the output signal at higher frequencies deteriorates towards the input of the first amplifier stage, because the reduction of the bandwidth of the first stage does influence the signal but not the noise contribution of the second stage. Here, bandwidth is to be understood to mean the bandwidth up to which the gain has decreased to unity.

These drawbacks are recognized in an article by T.J. van Kessel in "IEEE Journal of Solid-State Circuits", Vol. SC-3, No. 4, December 1968, pages 348-352 entitled "An integrated operational amplifier with novel HF behaviour". This article proposes an adequate reduction of the bandwidth of the second stage relative to the bandwidth of the first stage by means of a capacitance and an addition of the output signal of the first stage to the output signal of the second stage via a parallel signal path, in such a way that for frequencies where the gain of said second stage has rolled off substantially, the gain of the combination is equal to the gain of the first stage, so that the bandwidth of the combination is equal to the bandwidth of the first stage, which has the larger bandwidth of the two stages. In the case of a suitable choice of the frequency roll-off of the second stage, this also yields a roll-off of 6 dB per octave over the entire frequency range up to the frequency where the gain of the combination has decreased to unity. In this case, in contradistinction to the first-mentioned method, the bandwidth at which the gain of the combination has decreased to unity is equal to the bandwidth of the wide-band first stage and this correction method does not have the influence on the signal-to noise ratio.

In said article this correction method, which has been described in general terms, is illustrated on the basis of a specific operational amplifier, which has the drawback that said bypass path is comparatively high-ohmic because it comprises a resistor which also serves to add the output signals of the first and the second stage to each other. Especially the high frequency signal component becomes therefore available across a comparatively high impedance, which in its turn has the drawback that it is difficult to feed the output signal to an output of the operational amplifier via a buffer stage, specifically an emitter-follower or a class-B output stage, because then the input capacitance of said buffer stage together with the value of said resistor will give rise to an excessive time constant.

SUMMARY OF THE INVENTION

It is the object of the invention to indicate how the last-mentioned correction method can simply be applied to operational amplifiers. To this end, operational amplifiers of the type mentioned in the opening paragraph are characterized in that the first junction point is coupled to an output of the first amplifier stage and that the second junction point is coupled to an output of the second amplifier stage, the capacitive signal path relative to the signal path via the second amplifier stage constituting a positive feed-forward and the impedance at the second junction point, seen from said capacitive signal path, being comparatively high relative to the impedance at the first junction point, seen from said capacitive signal path.

For high frequencies, the signal on the first junction is fed to the second junction via said capacitive signal path. The output signal of the second stage—if said second stage does not already have a sufficiently small bandwidth by designing it accordingly—is short-circuited to the first junction via said capacitive signal path, for which purpose said first junction point is low-ohmic. The capacitive signal path thus constitutes a low-ohmic passage for the high-frequency signal component from the first stage to the second junction and, if required, limits the bandwidth of said second stage in that this capacitive signal path forms a high-frequency short-circuit for the output of the second stage, so that noise and other spurious signals generated in said second stage outside its pass-band are short-circuited. The second junction point may readily be coupled to an output of the operational amplifier via a buffer amplifier, because for high frequencies, said junction point is connected to the comparatively low-ohmic first junction point via said capacitive signal path.

An embodiment of an operational amplifier is characterized in that said output of the first amplifier stage is connected to the first junction point via a voltage follower.

This embodiment may further be characterized in that said output, in addition, is connected directly to an input of the second amplifier stage. This enables a high-ohmic drive of the second amplifier stage, while the first junction point is low-ohmic.

Alternatively, it may be advantageous that an input of the second amplifier stage is connected directly to the first junction point. If the first junction point is connected to an output of the first amplifier stage via a voltage follower, said voltage follower may have a level-shifting function in addition to its impedance-reducing function.

It is alternatively possible that an input of the second amplifier stage is coupled to an output of the first amplifier stage other than the output to which the first junction point is coupled.

Operational amplifiers in which the second amplifier stage is a differential amplifier may be characterized in that a further input of the second amplifier stage is coupled to an output of the first amplifier stage other than the output to which the first junction point is coupled.

If it is difficult to achieve that the second amplifier stage meets both the requirements with respect to the gain factor and those with respect to the maximum output current variation per unit of time (slew rate), it may be advantageous that this amplifier stage at least meets the requirements with respect to the gain factor and that for the requirements with respect to the slew rate the operational amplifier furthermore comprises a third amplifier stage whose gain is substantially smaller, but whose maximum output current variation per unit of time is substantially greater than that of the second amplifier stage, one or more inputs of the third amplifier stage being coupled to one or more outputs of the first amplifier stage in such a way that the signal path via the third amplifier stage relative to the signal path via the second amplifier stage constitutes a positive feed-forward.

In general, embodiments of operational amplifiers in accordance with the invention may be characterized in that the second junction point is coupled directly to that output of the second amplifier stage which leads to an output of the operational amplifier. The combination of the signals which are amplified via the second amplifier stage and the signals which appear on the first junction point via the capacitive signal path is then effected directly on one junction point.

DESCRIPTION OF THE DRAWING

The invention will now be described in more detail with reference to the drawings, in which FIG. 1A schematically illustrates the circuit arrangement of an operational amplifier with two amplifier stages and FIG. 1B illustrates graphically the gain as a function of the frequency, FIG. 2A illustrates the operational amplifier of FIG. 1A to which a known frequency compensation method is applied and FIG. 2B illustrates graphically the effect of this compensation on the gain, FIG. 3 schematically illustrates an operational amplifier using a known alternative compensation method, FIG. 4A schematically illustrates an operational amplifier with improved frequency compensation and FIG. 4B illustrates graphically the effect thereof on the frequency diagram, and FIG. 5 schematically illustrates an operational amplifier with frequency compensation in accordance with the invention.

DESCRIPTION OF THE PREFERRED EMBODIMENT

Figure 6:
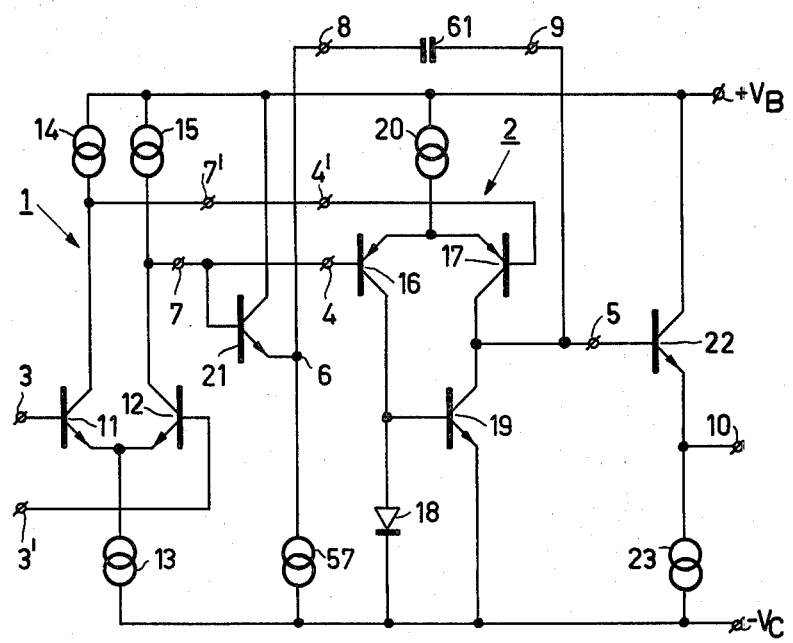
FIGS. 6 to 9 show four embodiments of an operational amplifier with frequency compensation in accordance with the invention.

FIG. 1A shows an operational amplifier having a first stage 1 and a second stage 2. The output 7 of the first stage 1 is connected to an input 4 of the second stage 2. In FIG. 1B the gain as a function of the frequency for the first stage 1, the second stage 2 and the overall gain of the two stages is represented by the logarithmically scaled characteristics a1, a2 and a1a2 respectively. The first stage has a gain a1, which for low frequencies is equal to A1 and for high frequencies decreases at 6 dB per octave and is equal to 1 at a frequency $f_1$. The second stage 2 has a gain a2, which for low frequencies is equal to A2 and for high frequency decreases at 6 dB per octave and is equal to 1 at a frequency f2. The two stages together have a gain a1a2, which for low frequencies is equal to A1A2 and for high frequencies decreases depending on the location of the frequencies f1 and f2, the roll-off being 12 dB per octave in the range where the both stages 1 and 2 have a roll-off of 6 dB per octave. If negative feedback were applied to such an operational amplifier, this negative feedback would result in positive feedback for frequencies where the roll-off is 12 dB per octave owing to the attendant phase shift, which may lead to undesired instabilities. FIG. 2A represents a solution for this.

FIG. 2A represents the same configuration as FIG. 1A, but in amplifier stage 1, an RC network 60, 61 is included at a suitable location, so that the gain of the first stage 1 already has decreased to unity before that of amplifier stage 2 rolls off (see diagram FIG. 2B). In the range where the amplifier stage 1 has a gain a1=1 the gain a1a2 of the combination is fully determined by the amplifier stage 2 with the gain a2. In the case of a suitable dimensioning of the network 60, 61, the roll-off of the stage 2 is exactly in conformity with the roll-off of the first stage 1 caused by the network 60, 61 and a linear roll-off of 6 dB per octave is obtained, the overall gain a1a2 having decreased to unity at a frequency f2 where the gain of the second stage 2 has also decreased to unity.

FIG. 3 represents an alternative frequency compensation. A capacitor 61 is included in parallel with the amplifier stage 2, which constitutes a Miller integrator with said capacitor 61. Stage 2 is then inverting and its output impedance Ri2 is comparatively low relative to the output impedance Ri1 of the first stage. Owing to the Miller effect, the capacitor 61 may have a small capacitance. Further, the effect of the step is substantially the same as the effect of the step applied to the operational amplifier of FIG. 2A. The drawbacks of this are that the bandwidth of the combination of the two stages is limited to the bandwidth of the second stage, which has the smaller bandwidth of the two. Moreover, limiting the bandwidth of the first stage has the drawback that the noise contribution of the second stage results in a disproportionable deterioration of the signal-to-noise ratio of the combination for high frequencies.

FIG. 4A represents the solution proposed by T. J. van Kessel in the article mentioned in the introduction. By means of a suitably arranged capacitor 61 in the second stage, the bandwidth of the second stage is made smaller than the bandwidth of the first stage and the output signal of the first stage is added to the output signal of the second stage via a parallel path. The gain of the combination of the two stages then becomes equal to a1(a2+1), which for low frequencies is substantially equal to A1(A2+1) and for high frequencies is equal to a1. The bandwidth of the combination thus becomes equal to the bandwidth of the first stage, which has the larger bandwidth. Since the bandwidth of the first stage is not limited relative to that of the second stage, this solution does not have the drawback of a deteriorated signal-to-noise ratio for high frequencies. However, this is related to the location of the capacitor 61, because when capacitor 61 is included at the input of the second stage, noise sources at the output of said second stage may still contribute to the signal-to-noise ratio. Moreover, the parallel path across amplifier stage 2 should be arranged so that amplifier stage 2 is not short-circuited thereby. Although the compensation principle presented by T. J. van Kessel has many advantages, it cannot readily be realized in operational amplifiers.

FIG. 5 schematically represents the further elaboration, according to the invention, of the last-mentioned principle adapted to suit practical applications. Here the second amplifier is bridged by a capacitance 61, included between the junction point 8 and 9, which may be the terminals of the IC which incorporates the operational amplifier. The bypassed part of the amplifier stage 2 is then non-inverting, while the output impedance Ri2 at output 5 is comparatively high relative to the output impedance Ri1 at the output 7 of amplifier stage 1. The operating principle is as follows. For low frequencies the gain is equal to the product of the gain factors of the two amplifier stages. For high frequencies, the gain of amplifier stage 2, if it does not inherently roll off because this stage has the smaller bandwidth of the two stages, is reduced in that output 5 of amplifier stage 2 is short-circuited to the comparatively low-ohmic output 7 of amplifier stage 1 via capacitor 61, while the high frequency signal supplied from the low-ohmic output by amplifier stage 1 appears on output 5 via capacitor 61. The high-frequency gain of the combination of the two amplifier stages 1 and 2 is consequently equal to that of the first stage 1. Moreover, amplifier stage 2 can no longer contribute to the signal on output 5 and thus can no longer deteriorate the signal-to-noise ratio.

FIG. 6 shows a first embodiment of an operational amplifier in accordance with the invention. The first amplifier stage 1 is constituted by a differential amplifier with inputs 3 and 3', which are connected to the bases of transistors 11 and 12, which are connected as a differential pair with common-emitter current source 13 and collector load-current sources 14 and 15. The collectors of transistors 11 and 12 lead to differential output terminals 7 and 7', which in the present example are comparatively high-ohmic owing to the current-source loads 14 and 15, which drive inputs 4 and 4' of a second stage 2. This second stage 2 also comprises a differential amplifier with transistors 16 and 17 connected as a differential pair, with common emitter current source 20, its collector current being coupled out to an output 5 via a current mirror comprising a diode 18 and a transistor 19. Thus, the second stage constitutes a transconductance amplifier with current-source output. In order to enable said output to be connected to a comparatively low-ohmic output of amplifier stage 1 via a capacitor 61, output 7 of amplifier stage 1 is connected to a point 6, which constitutes a low-ohmic output of the amplifier stage 1, via a transistor 21 in emitter-follower arrangement. Capacitor 61 is now included between point 6 and output 5, in the present example via terminals 8 and 9 in order to indicate that the capacitor 61 itself need not form part of the integrated circuit but may be connected by the user of this integrated circuit.

For high frequencies, output 5 is connected to the low-ohmic emitter of transistor 21 via capacitor 61 and high-frequency currents in output 5 are short-circuited to the emitter of transistor 21 via capacitor 61. For the high frequencies, the signal voltage on output 5 is completely determined by the signal voltage on the emitter of transistor 21 and thus by the signal supplied by the first amplifier stage 1.

An output stage, which in the present example is constituted by the transistor 22 in emitter-follower arrangement with an emitter current source 23, is connected to output 5. The emitter of said transistor 22 leads to an output terminal 10 of the operational amplifier, which output terminal may be a terminal of the integrated circuit.

The base of transistor 22 receives its high-frequency drive from the low-ohmic emitter of transistor 21 via capacitor 61, so that a suitable high-frequency behavior of transistor 22 can be obtained because the base circuit of transistor 22 presents a low impedance to said high frequencies, which means a comparatively small time constant.

Figure 7:
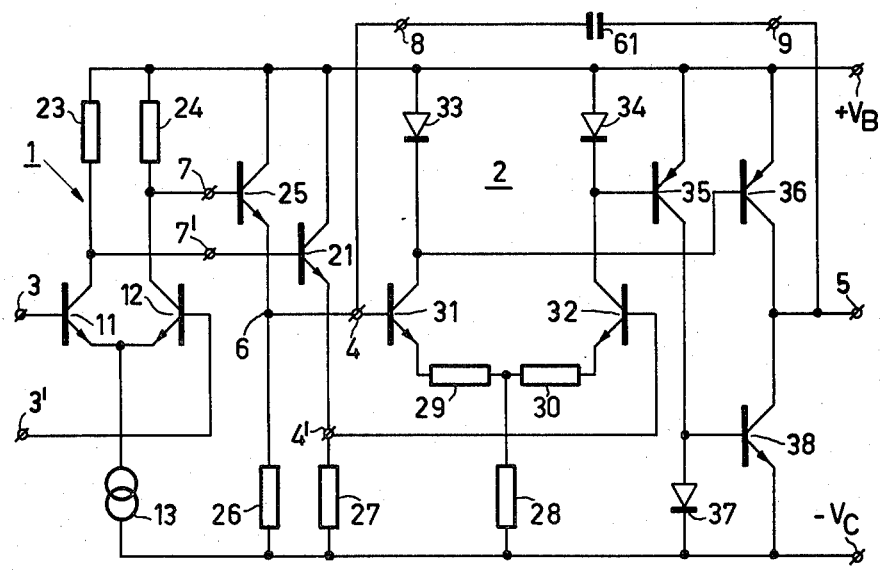

FIG. 7 shows a second example of an operational amplifier in accordance with the invention. It comprises a first amplifier stage 1 with transistors 11 and 12 arranged as a differential pair with a common emitter current source 13 and collector load resistors 23 and 24. The outputs 7 and 7', which are respectively connected to the collectors of transistors 12 and 11, are connected to the inputs of a second stage 2 via respective emitter-follower transistors 25 and 21, which second stage comprises two transistors 31 and 32 connected as a differential pair via emitter resistors 29, 30 and 28. The collector current of transistor 31 is "reflected" to an output 5 via a current mirror with diode 33 and transistor 36 and the collector current of transistor 32 is also "reflected" to the output 5 via a current mirror with diode 34 and transistor 35 and a current mirror with diode 37 and transistor 38. Capacitor 61 is included between the low-ohmic emitter of transistor 25 and output 5. Further, the operation corresponds to the operation as described with reference to FIG. 5.

Figure 8:
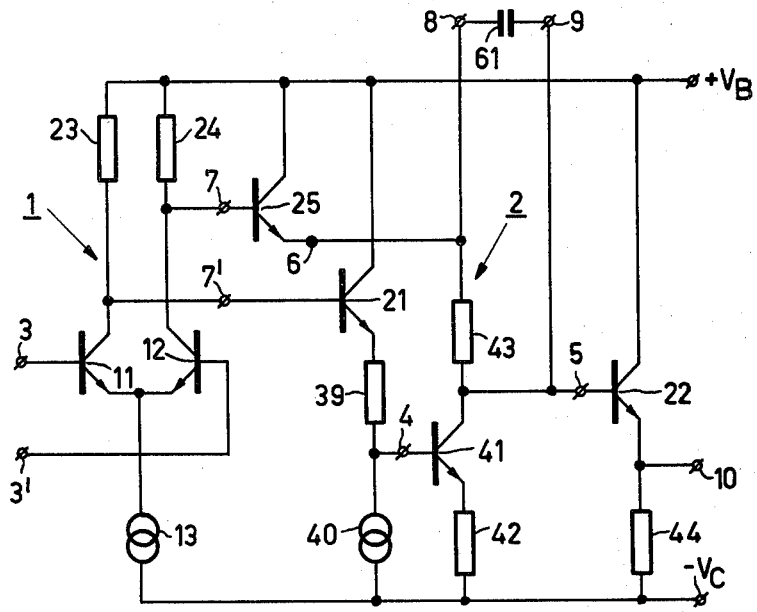

FIG. 8 shows a third embodiment of an operational amplifier in accordance with the invention comprising a first amplifier stage 1 whose circuit arrangement corresponds to that of the amplifier stage 1 in the operational amplifier of FIG. 7. The second amplifier stage 2 comprises an amplifier transistor 41 with an emitter resistor 42 and a collector load resistor 43. An output 5 is connected to the collector of transistor 41. Via resistor 39, the base of transistor 41 is driven, by means of emitter-follower transistor 21, by output 7' of amplifier stage 1. A level shift is then obtained in that a current source 40 produces a direct-voltage drop across resistor 39. In order to obtain a further increase of the low-frequency gain, the output voltage on the other output 7 of the first amplifier stage is applied to transistor 41 via emitter-follower transistor 25 at that end of the collector resistor 43 which is remote from the output 5. For high frequencies the emitter of said emitter-follower transistor 25 is also connected to output 5 via capacitor 61. Via an emitter-follower circuit with transistor 22 and resistor 44, output 5 is connected to output 10 of the operational amplifier circuit. The operation of this embodiment with respect to high-frequency compensation is identical to that as described with reference to FIG. 5.

Figure 9:
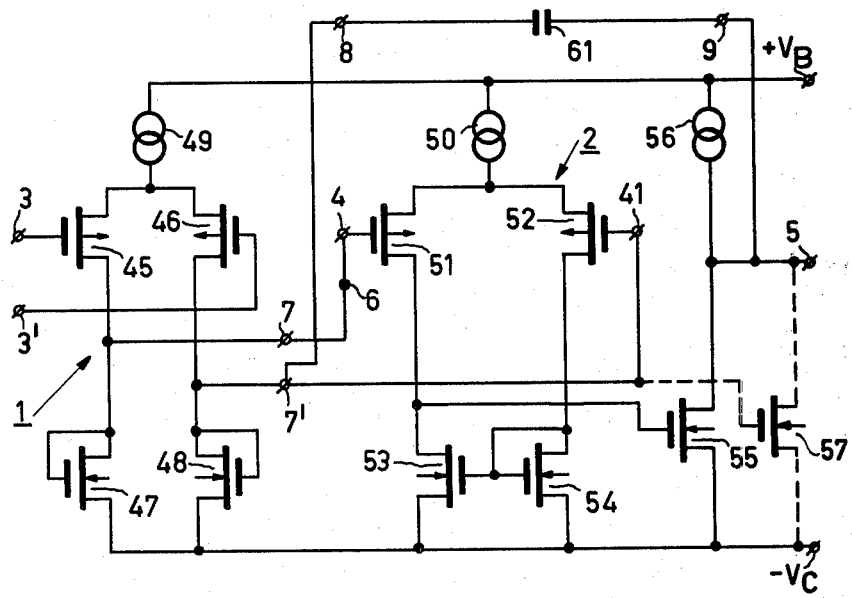

FIG. 9 shows a fourth embodiment of an operational amplifier in accordance with the invention equipped with insulated-gate field-effect transistors. The first amplifier stage 1 comprises two p-channel field-effect transistors 45 and 46, connected as a differential pair, with a common source-current source 49 and with n-channel transistors 47 and 48 included in the drain circuits as loads. The second amplifier stage 2 comprises a similar stage, but includes a current mirror, constituted by transistors 53 and 54, for coupling out the drain current and an n-channel transistor 55 with a drain load-current source 56 for further amplification to output 5. Output 7' of the first stage in this MOS version is sufficiently low-ohmic relative to output 5 of the second stage, so that the capacitor 61 is included between output 7' of amplifier stage 1 and output 5 of amplifier stage 2 without the use of a voltage follower (such as for example transistor 21 in the circuit arrangement of FIG. 6).

A third amplifier stage having a substantially lower gain but a substantially higher slew rate than the second amplifier stage may be added to the present example in accordance with FIG. 9 in the form of the n-channel field-effect transistor 57 represented by the dashed connections. The gate electrode of this transistor is connected to output 7' of the first amplifier stage, the source electrode to the negative supply voltage Vc, and the drain electrode to output 5. In the case of rapid signal variations that cannot be followed by the second amplifier stage the third amplifier stage will provide the output signal on point 5, though with a gain which is smaller than the gain provided by the second stage for slower signal variations. However, this smaller gain of the third amplifier stage should present no problems in the case of an operational amplifier with a sufficient degree of negative feedback.

In all the embodiments, in conformity with the description with reference to FIG. 5, the part of amplifier stage 2 shunted by capacitor 61 is non-inverting and the output impedance Ri2 at output 5 of the second stage, viewed from capacitor 61, is comparatively high relative to the impedance Ri1, viewed from capacitor 61, of point 6 via which capacitor 61 is coupled to an output of the first amplifier stage 1.

Since for high frequencies capacitor 61 by passes a non-inverting stage and thus provides feed-forward, the requirement: $g_m \cdot Ri1 \leq 1$ should be met in order to prevent instabilities, $g_m$ being the transconductance of the second stage 2 from point 6 to output 5.

What is claimed is:

1. An operational amplifier comprising at least a first amplifier stage, a second amplifier stage, which is driven by the first amplifier stage, and a first and a second junction point between which a capacitive signal path, for improving the high-frequency properties of the operational amplifier, is included characterized in that the first junction point is coupled to an output of the first amplifier stage and that the second junction point is coupled to an output of the second amplifier stage, the capacitive signal path, relative to the signal path via the second amplifier stage, constituting a positive feed-forward and the impedance at the second junction point, viewed from said capacitive signal path, being comparatively high-relative to the impedance at the first junction point, viewed from said capacitive signal path.

2. An operational amplifier as claimed in claim 1, characterized in that said output of the first amplifier stage is connected to the first junction point via a voltage follower.

3. An operational amplifier as claimed in claim 2, characterized in that said output of the first amplifier stage, in addition, is connected directly to an input of the second amplifier stage.

4. An operational amplifier as claimed in claim 3, characterized in that a further input of the second amplifier stage is coupled to an output of the first amplifier stage other than the output to which the first junction point is coupled.

5. An operational amplifier as claimed in claim 1 or 2, characterized in that an input of the second amplifier stage is connected directly to the first junction point.

6. An operational amplifier as claimed in claim 5, characterized in that a further input of the second amplifier stage is coupled to an output of the first amplifier stage other than the output to which the first junction point is coupled.

7. An operational amplifier as claimed in claim 1 or 2, characterized in that an input of the second amplifier stage is coupled to an output of the amplifier stage other than the output to which the first junction point is coupled.

8. An operational amplifier as claimed in claim 1, characterized in that the second junction point is coupled directly to that output of the second amplifier stage which leads to an output of the operational amplifier.

9. An operational amplifier as claimed in claim 1, characterized in that said operational amplifier further comprises a third amplifier stage whose gain is substantially smaller but whose maximum output current variation per unit of time is substantially greater than that of the second amplifier stage, one or more inputs of the third amplifier stage being coupled to one or more outputs of the first amplifier stage in such a way that the signal path via the third amplifier stage realtive to the signal path via the second amplifier stage constitutes a positive feed-forward.

* * * * *